(12) United States Patent
Lee et al.

(10) Patent No.: US 9,725,625 B2
(45) Date of Patent: Aug. 8, 2017

(54) CONDUCTIVE ADHESIVE WITH SPHERICAL GRAPHENE AND MANUFACTURING METHOD THEREOF

(71) Applicant: Shenzhen China Star Optoelectronics Technology Co., Ltd., Shenzhen, Guangdong (CN)

(72) Inventors: Yungjui Lee, Guangdong (CN); Xia Zhang, Guangdong (CN); Ji Li, Guangdong (CN); Yahui Chen, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 219 days.

(21) Appl. No.: 14/398,978

(22) PCT Filed: Aug. 14, 2014

(86) PCT No.: PCT/CN2014/084332
§ 371 (c)(1),
(2) Date: Nov. 5, 2014

(87) PCT Pub. No.: WO2016/011683
PCT Pub. Date: Jan. 28, 2016

(65) Prior Publication Data
US 2016/0280968 A1    Sep. 29, 2016

(30) Foreign Application Priority Data

Jul. 22, 2014   (CN) .......................... 2014 1 0352367

(51) Int. Cl.
C01B 31/04    (2006.01)
H01B 1/24    (2006.01)
(Continued)

(52) U.S. Cl.
CPC ................. *C09J 9/02* (2013.01); *B01J 2/003* (2013.01); *B01J 2/06* (2013.01); *C01B 31/0453* (2013.01);
(Continued)

(58) Field of Classification Search
CPC ... C01B 31/0453; C01B 31/0438; H01B 1/04; H01B 1/24; B82Y 40/00; B82Y 30/00
(Continued)

(56) References Cited

U.S. PATENT DOCUMENTS

2008/0296023 A1* 12/2008 Willauer ................. C08K 3/08
166/302
2010/0276645 A1* 11/2010 Aspin ........................ C09J 9/02
252/513
(Continued)

FOREIGN PATENT DOCUMENTS

CN    102544459 A  *  7/2012 ............. H01M 4/38
CN    102791628 A     11/2012
CN    103805118 A      5/2014

OTHER PUBLICATIONS

Lee ("Chemical Vapor Deposition of Mesoporous Graphene Nanoballs for Supercapacitor." ACSNano, 7(7), pp. 6047-6055, publ Jun. 20, 2013).*

*Primary Examiner* — Tri V Nguyen
(74) *Attorney, Agent, or Firm* — Andrew C. Cheng

(57) ABSTRACT

The invention provide a manufacturing method for producing conductive adhesive with spherical graphene, and the steps comprise as following: step 1: preparing monomer, initiator, a dispersing agent and solvent to manufacture a monomer compound, and use the monomer compound to produce polymer micro ball; step 2: heating pre-treatment or plasma etching pre-treatment to the said polymer micro ball; step 3: by chemical vapor deposition, the polymer micro ball after pre-treatment from step 2 to grow graphene outside
(Continued)

surfaces or inside polymer micro ball, and then obtain the spherical graphene; step 4: producing epoxy gel system made by epoxy, hardener and accelerant with a certain ratio mixing homogeneously; step 5: dispersing the spherical graphene from step 3 into the epoxy gel system to produce pre-material of conductive adhesive of spherical graphene; Step 6: deforming the pre-material of conductive adhesive of spherical graphene, and then obtain conductive adhesive of spherical graphene.

8 Claims, 1 Drawing Sheet

(51) Int. Cl.
  *B82Y 30/00*   (2011.01)
  *C09J 163/00*   (2006.01)
  *C09J 9/02*   (2006.01)
  *B01J 2/00*   (2006.01)
  *B01J 2/06*   (2006.01)
  *C23C 16/02*   (2006.01)
  *C23C 16/26*   (2006.01)
  *C23C 16/44*   (2006.01)
  *C23C 16/48*   (2006.01)

(52) U.S. Cl.
  CPC ......... *C09J 163/00* (2013.01); *C23C 16/0209* (2013.01); *C23C 16/0245* (2013.01); *C23C 16/26* (2013.01); *C23C 16/4417* (2013.01); *C23C 16/481* (2013.01); *H01B 1/24* (2013.01); *C01P 2004/32* (2013.01)

(58) Field of Classification Search
  USPC .......... 252/502–510, 500; 423/445 R, 445 B, 423/447.3, 448; 977/755, 843, 932
  See application file for complete search history.

(56) References Cited

U.S. PATENT DOCUMENTS

| | | | |
|---|---|---|---|
| 2011/0171454 A1* | 7/2011 | Hitoe | B82Y 30/00 428/292.1 |
| 2015/0065613 A1* | 3/2015 | Balijepalli | C08G 59/50 523/466 |

* cited by examiner

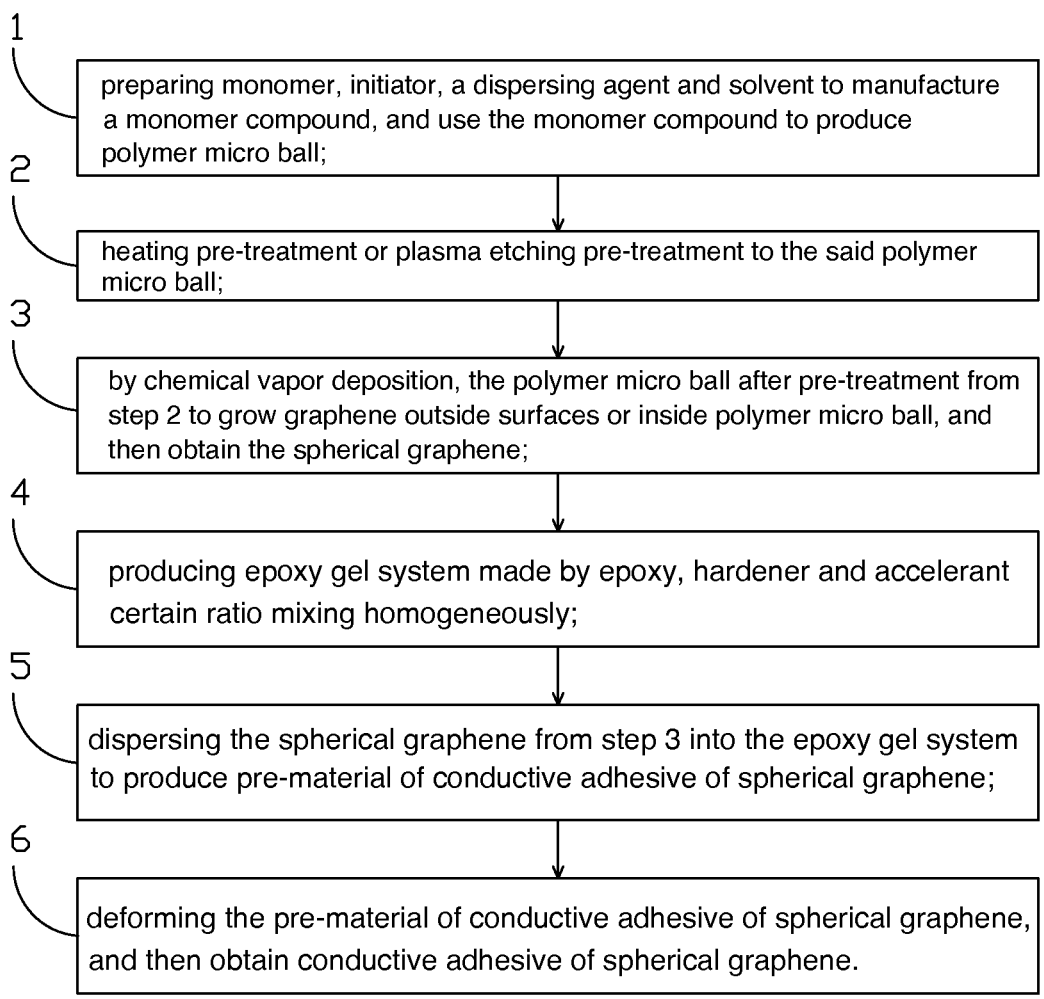

US 9,725,625 B2

CONDUCTIVE ADHESIVE WITH SPHERICAL GRAPHENE AND MANUFACTURING METHOD THEREOF

FIELD OF THE INVENTION

The invention relates to Liquid Crystal Display (LCD) field, especially to a conductive adhesive with spherical graphene and a manufacturing method thereof.

BACKGROUND OF THE INVENTION

Usually thin film transistor liquid crystal display (TFT-LCD) arrange all tapping electrode on one side, electronically co-connect array side and CF side to the same glass substrate by conductive point, and drive chip attached on said substrate. The conductive point is usually composed of thermalsetting epoxy resin, glass fibers and 1 wt %~2 wt % Au ball. Au ball is based on a spherical elastic material (ex: Acrylic acid) by plating a layer of Nickel firstly, and then plating Gold afterword. Being an elastic conductivity micro ball, the radius is usually from 5 to 8 µm, and conductivity reaches to $2.4 \times 10^5$ $Scm^{-1}$. Procedures of traditionally manufacturing Au balls need to induce active targets at chemical reactions on surface of basal body via cleaning, light etching, sensitization, and activation, and then chemically plating nickel and gold afterword; so does present manufacturing technology of Au ball. However, there are some defects for this method: firstly, adhesion and homogeneity of the nickel plating maybe affected due to sensitization of polymer materials to absorb some tin ions; secondly, based on Autoctalytic Deposition for this case, $Au(CN)2-+Ni \rightarrow Au+Ni2++2CN-$, the nickel ions exists automatically, and to control the plating layer for the crystal layer, cobalt ions is added in the action, furthermore, the defect is that polymer materials may get together due to those metal ions; thirdly, gold salt used in the gold plating is cyanide, which is poison; lastly, after plating, nickel recycle is difficult, and abandon directly is not good for environment protection.

To solve the aforementioned defects, CN102352495B disclosed a monodisperse manufacture, which abandoned tin dichloride dehydrate and poison cyanide; instead, after slightly corroding, surfaces of polymer materials absorb polymers with positive electricity; placing those polymer material into gold or platinum melting with negative electricity; lastly, chemically plating a layer of gold on the polymer materials. This simplifies the technology of pre-treatment, and the polymer surface is smooth and elegant. However, to obtain a polymer with hundreds Å thick, it is time-consuming to take couple times depositions, purifications and other procedures; moreover, the cost is high due to metal melting usage is a lot and expensive.

Graphene can be applied extensively in Lithium battery, supercapacitor, solar cell, semiconductor, LCD, sensing element and etc., due to its properties of high conductivity ($10^6$ $Scm^{-1}$), good charge carrier mobility ($10^5$ $cm^2$ $V^{-1}$ $s^{-1}$), outstanding mechanical performance ($10^{60}$ GPa) and flexibility. EP2537801A1 shows organic compound pre-baked in a sealed space to make organic compound decomposed and produce gas with hydrogen and carbon, and then after HIP treatment, a mass of graphene grown within organic space with 1 nm thick. Disperse those graphene mass into solvent to ultrasonic wave treatment and collect supernatant therefrom. This is a mass production for high quality of graphene, which maintains its high conductivity.

SUMMARY

The invention is to provide a simple manufacturing method with abundant source, low cost, and poison-free which is an advantage to environment protection.

The invention is also to provide a conductive adhesive with spherical graphene with special structure, good conductivity and nice environment and etc. With its properties, the conductive adhesive can replace Au balls to be applied in TFT-LCD, and applied in other conductive materials. To reach to goal mentioned above, the invention provides a manufacturing method for the conductive adhesive, and steps comprise as following:

step 1: preparing a monomer, an initiator, a dispersing agent and a solvent to manufacture a monomer mixture, and using the monomer mixture to produce a polymer microsphere;

step 2: heating pre-treatment or plasma etching pre-treatment to the polymer microsphere;

step 3: by chemical vapor deposition, the polymer microsphere after pre-treatment from step 2 to grow graphene on the surfaces of or inside the polymer microsphere, and then obtain the spherical graphene;

step 4: producing an epoxy gel system made by epoxy, hardener and accelerant with a certain ratio mixing homogeneously;

step 5: dispersing the spherical graphene from step 3 into the epoxy gel system to produce pre-material of conductive adhesive with spherical graphene; and step 6: defoaming the pre-material of conductive adhesive of spherical graphene, and then obtain the conductive adhesive with spherical graphene.

In the step 1, the monomer is acrylic acid, phenylethene, methyl methacrylate or divinylbenzene; the initiator is comprising at least one selected from azobisisobutyronitrile and benzoyl peroxide; the dispersing agent is polyvinylpyrrolidone, polyethylene glycol, polyglycolic acid or polyacrylic acid; the solvent is comprising water and a composition mixed at least one selected from ethanol, methanol or isopropanol. An amount of for the monomer to the monomer mixture is between 8 wt %~42 wt %; an amount of the initiator to the monomer mixture is between 0.11 wt %~5.2 wt %; an amount of the dispersing agent to the monomer mixture is between 4.9 wt %~21 wt %; an amount of the solvent to the monomer mixture is between 3 wt %~56 wt %.

In the step 2, the method of the heating pre-treatment is to obtain a porous polymer microsphere by dispersing the polymer microsphere into inert atmosphere at 100-500° C. for 0.5-5 h.

In the step 2, the method of the plasma etching pre-treatment is to obtain an active polymer microsphere by light etching the polymer micro balls with inductively coupled plasma, which is sulfur hexafluoride and dioxygen, at 80-150° C. for 2 min~1 h.

In the step 3, steps of the chemical vapor deposition are dispersing the polymer microsphere after pre-treatment from the step 2 into a sealed space of chemical vapor deposition; next, inserting a mixture gas of methane, hydrogen and other auxiliary gas inside the sealed space after vacuuming; and then growing graphene on the surfaces of or inside the polymer microsphere by heating the polymer micro ball in step 2 after pre-treatment by at least one way following: infrared ray, thermal radiation, laser, micro-wave, plasma, ultraviolet ray or induction heating.

A volume ratio for the methane to the mixture gas is 1%~10%; a volume ratio for the hydrogen to the mixture gas is 50%~99%; the other auxiliary gas is comprising at least one selected from vapor, nitrogen, or argon.

The epoxy in step 4 is bisphenol A epoxy resins E44, bisphenol A epoxy resins E51, bisphenol A epoxy resins E54, bisphenol A epoxy resins EPON826 or bisphenol A epoxy resins EPON828; the hardener is hexahydrophthalic anhydride, tetrahydrophthalic anhydride, succinic dihydrazide, adipic acid dihydrazide, dicyandiamide or phenylenediamine; the accelerant is 2-ethyl-4-methylimidazole, imidazole, 2-methylimidazole or triethylamine;

An amount of the epoxy to the epoxy gel system is 80 wt %~95 wt %; an amount of the hardener to the epoxy gel system is 1 wt %~12 wt %; and an amount of the accelerant to the epoxy system is 0.3 wt %~5 wt %.

In step 5, a mass ratio for the epoxy system to the spherical graphene is 100:2~30.

The invention also provides a conductive adhesive comprising spherical graphene and an epoxy gel system, wherein mass ratio for the epoxy system to the spherical graphene is 100:2~30; the epoxy gel system is comprising epoxy, hardener and accelerant; the epoxy is bisphenol A epoxy resins E44, bisphenol A epoxy resins E51, bisphenol A epoxy resins E54, bisphenol A epoxy resins EPON826 or bisphenol A epoxy resins EPON828; an amount of the epoxy to the epoxy gel system is 80 wt %~95 wt %; the hardener is hexahydrophthalic anhydride, tetrahydrophthalic anhydride, succinic dihydrazide, adipic acid dihydrazide, dicyandiamide or phenylenediamine; an amount of the hardener to the epoxy gel system is 1 wt %~12 wt %; the accelerant is 2-ethyl-4-methylimidazole, imidazole, 2-methylimidazole or triethylamine; an amount of the accelerant to the epoxy system is 0.3 wt %~5 wt %.

The invention provides a manufacturing method for producing conductive adhesive with spherical graphene, and the steps comprise as following:

step 1: preparing a monomer, an initiator, a dispersing agent and a solvent to manufacture a monomer mixture, and using the monomer mixture to produce a polymer microsphere;

wherein, the monomer is acrylic acid, phenylethene, methyl methacrylate or divinylbenzene, and an amount of the monomer to the monomer mixture is between 8 wt %~42 wt %;

the initiator is comprising at least one selected from azobisisobutyronitrile or benzoyl peroxide, and an amount of the initiator to the monomer mixture is between 0.11 wt %~5.2 wt %;

the dispersing agent is polyvinylpyrrolidone, polyethylene glycol, polyglycolic acid or polyacrylic acid, and an amount of the dispersing agent to the monomer mixture is between 4.9 wt %~21 wt %;

the solvent is comprising water and a composition mixed at least one selected from ethanol, methanol or isopropanol, and an amount of the solvent to the monomer mixture is between 3 wt %~56 wt %;

step 2: heating pre-treatment or plasma etching pre-treatment to the said polymer microsphere;

the method of the heating pre-treatment is to obtain porous polymer microsphere by dispersing the polymer microsphere into inert atmosphere (nitrogen or argon); at 100-500° C. for 0.5-5 h.

the method of the plasma etching pre-treatment is to obtain active polymer microsphere by etching the polymer micro balls with inductively coupled plasma, which is sulfur hexafluoride and dioxygen, at 80-150° C. for 2 min~1 h;

step 3: by chemical vapor deposition, the polymer microsphere after pre-treatment from step 2 to grow graphene inside or outside the polymer microsphere, and then obtain the spherical graphene;

steps of the chemical vapor deposition are dispersing the polymer microsphere after pre-treatment from the step 2 into a sealed space of chemical vapor deposition; next, inserting a mixture gas of methane, hydrogen and other auxiliary gas inside the sealed space after vacuuming; and then growing graphene on the surface of or inside the polymer microsphere via heating the polymer micro ball in step 2 after pre-treatment by at least one way listed as following: infrared ray, thermal radiation, laser, micro-wave, plasma body, ultraviolet ray or heat induction;

wherein a volume ratio for the methane to the mixture gas is 1%~10%; a volume ratio for the hydrogen to the mixture gas is 50%~99%; the other auxiliary gas is comprising is at least one selected from vapor ($H_2O$), nitrogen ($N_2$), or argon (Ar);

In step 3, growing layers of the grapheme can be controlled by adjusting the mixture gas in flow rate in the sealed space of chemical vapor deposition to obtain spherical grapheme with best conductivity via process optimization;

step 4: producing epoxy gel system is made by epoxy, hardener and accelerant with a certain ratio mixing homogeneously;

the epoxy is bisphenol A epoxy resins E44, bisphenol A epoxy resins E51, bisphenol A epoxy resins E54, bisphenol A epoxy resins EPON826 or bisphenol A epoxy resins EPON828, and an amount of the epoxy to the epoxy gel system is 80 wt %~95 wt %;

the hardener is hexahydrophthalic anhydride, tetrahydrophthalic anhydride, succinic dihydrazide, adipic acid dihydrazide, dicyandiamide or phenylenediamine, and an amount of the hardener to the epoxy gel system is 1 wt %~12 wt %;

the accelerant is 2-ethyl-4-methylimidazole, imidazole, 2-methylimidazole or triethylamine, and an amount of the accelerant to the epoxy system is 0.3 wt %~5 wt %.

step 5: dispersing the spherical graphene from step 3 into the epoxy gel system to produce pre-material of conductive adhesive with spherical graphene;

wherein a mass ratio for the epoxy system to the spherical graphene is 100:2~30;

Step 6: defoaming the pre-material of conductive adhesive with spherical graphene, and then obtain the conductive adhesive with spherical graphene.

Advantages of the invention: in the invention, the manufacturing method for producing conductive adhesive with spherical graphene by chemical vapor deposition (CVD) to grow graphene outside surfaces or inside polymer micro balls to produce spherical graphene first, and then mix the graphene and the epoxy system with a certain ratio to obtain the conductive adhesive of spherical graphen. The invention is to provide a simple manufacturing method with abundant source, low cost, and poison-free which is an advantage to environment protection. The invention is to provide a conductive adhesive with spherical graphene with special structure, good conductivity and nice environment and etc. With its properties, the conductive adhesive can replace Au balls to be applied in TFT-LCD, and applied in other conductive materials, for example: Anisotropic conductive paste (ACP) or Anisotropic Conductive Film (ACF), which is with good potential in business development.

BRIEF DESCRIPTION OF THE DRAWING

Example embodiments will be more clearly understood from the following detailed description taken in conjunction with the accompanying drawings. FIGS. 1-10 represent non-limiting, example embodiments as described herein.

FIG. 1 shows a flow chart of manufacturing method for a conductive adhesive to the invention.

DETAILED DESCRIPTION OF THE EMBODIMENTS

Reference will now be made in detail to example embodiments, examples of which are illustrated in the accompanying drawings, wherein like reference numerals refer to like elements throughout. In this regard, the present example embodiments may have different forms and should not be construed as being limited to the descriptions set forth herein. Specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

As shown in FIG. 1, the invention provides a manufacturing method for producing conductive adhesive with spherical graphene, and the steps comprise as following:

step 1: preparing a monomer, an initiator, a dispersing agent and a solvent to manufacture a monomer mixture compound, and using use the monomer mixture compound to produce a polymer microsphere micro ball;

wherein, the monomer is acrylic acid, phenylethene, methyl methacrylate or divinylbenzene, and an amount of the monomer to the monomer mixture is between 8 wt %~42 wt %;

the initiator is comprising at least one selected from azobisisobutyronitrile or benzoyl peroxide, and an amount of the initiator to the monomer mixture is between 0.11 wt %~5.2 wt %;

the dispersing agent is polyvinylpyrrolidone, polyethylene glycol, polyglycolic acid or polyacrylic acid, and an amount of the dispersing agent to the monomer mixture is between 4.9 wt %~21 wt %;

the solvent is comprising water and a composition mixed at least one selected from ethanol, methanol or isopropanol, and an amount of the solvent to the monomer polymer is between 3 wt %~56 wt %;

step 2: heating pre-treatment or plasma etching pre-treatment to the said polymer microsphere;

the method of the heating pre-treatment is to obtain porous polymer microsphere by dispersing the polymer microsphere into inert atmosphere (nitrogen or argon) at 100-500 for 0.5-5 h.

the method of the plasma etching pre-treatment is to obtain active polymer microsphere by etching the polymer microsphere with inductively coupled plasma, which is sulfur hexafluoride and dioxygen, at 80-150° C. for 2 min-1 h.

step 3: by chemical vapor deposition, the polymer microsphere after pre-treatment from step 2 to grow graphene inside or outside the polymer microsphere, and then obtain the spherical graphene;

steps of the chemical vapor deposition are dispersing the polymer microsphere after pre-treatment from the step 2 into a sealed space of chemical vapor deposition; next, inserting a mixture gas of methane, hydrogen and other auxiliary gas inside the sealed space after vacuuming; and then growing graphene outside surfaces or inside balls via heating the polymer microsphere in step 2 after pre-treatment by at least one way listed as following: infrared ray, thermal radiation, laser, micro-wave, plasma, ultraviolet ray or induction heating;

wherein a volume ratio for the methane to the mixture gas is 1%/~10%; a volume ratio for the hydrogen to the mixture gas is 50%~99%; the other auxiliary gas is at least one selected from vapor ($H_2O$), nitrogen ($N_2$), or argon (Ar).

In step 3, growing layers of the grapheme can be controlled by adjusting the mixture gas in flow rate in the sealed space of chemical vapor deposition to obtain spherical grapheme with best conductivity via process optimization;

step 4: producing epoxy gel system is made by epoxy, hardener and accelerant with a certain ratio mixing homogeneously;

the epoxy is bisphenol A epoxy resins E44, bisphenol A epoxy resins E51, bisphenol A epoxy resins E54, bisphenol A epoxy resins EPON826 or bisphenol A epoxy resins EPON828, and an amount of the epoxy to the epoxy gel system is 80 wt %~95 wt %;

the hardener is hexahydrophthalic anhydride, tetrahydrophthalic anhydride, succinic dihydrazide, adipic acid dihydrazide, dicyandiamide or phenylenediamine, and an amount of for the hardener to the epoxy gel system is 1 wt %~12 wt %;

the accelerant is 2-ethyl-4-methylimidazole, imidazole, 2-methylimidazole or triethylamine, and an amount of the accelerant to the epoxy system is 0.3 wt %~5 wt %.

step 5: dispersing the spherical graphene from step 3 into the epoxy gel system to produce pre-material of conductive adhesive with spherical graphene;

wherein a mass ratio for the epoxy system to the spherical graphene is 100:2~30;

Step 6: defoaming the pre-material of conductive adhesive with spherical graphene, and then obtain conductive adhesive with spherical graphene.

the invention also provides a conductive adhesive comprising spherical graphene and an epoxy gel system, wherein mass ratio for the epoxy system to the spherical graphene is 100:2~30; the epoxy gel system is comprising epoxy, hardener and accelerant; the epoxy is bisphenol A epoxy resins E44, bisphenol A epoxy resins E51, bisphenol A epoxy resins E54, bisphenol A epoxy resins EPON826 or bisphenol A epoxy resins EPON828; an amount of the epoxy to the epoxy gel system is 80 wt %~95 wt %; the hardener is hexahydrophthalic anhydride, tetrahydrophthalic anhydride, succinic dihydrazide, adipic acid dihydrazide, dicyandiamide or phenylenediamine; an amount of the hardener to the epoxy gel system is 1 wt %~12 wt %; the accelerant is 2-ethyl-4-methylimidazole, imidazole, 2-methylimidazole or triethylamine; an amount of the accelerant to the epoxy gel system is 0.3 wt %~5 wt %.

In conclusion, in the invention, the manufacturing method for producing conductive adhesive with spherical graphene by chemical vapor deposition (CVD) to grow graphene outside surfaces or inside polymer microsphere to produce spherical graphene first, and then mix the graphene and the epoxy system with a certain ratio to obtain the conductive adhesive of spherical graphen. The invention is to provide a simple manufacturing method with abundant source, low cost, and poison-free which is an advantage to environment protection. Compared with traditional chemically plating manufacture of Au balls, the invention doesn't use tin dichloride dihydrate and poison gold salt.

In the invention, high cost issue of metal melting, gold salt can be solved by chemical vapor deposition (CVD) in manufacturing graphene due to its abundant source and easy-making hydrocarbon; moreover, without sensitization of tin dichloride dihydrate in the method, an issue of disturbing tin ions can be avoidable. The invention is to provide a conductive adhesive with spherical graphene with special structure, good conductivity and nice environment and etc. With its properties, the conductive adhesive can replace Au balls to be applied in TFT-LCD, and applied in other conductive materials, for example: Anisotropic conductive paste (ACP) or Anisotropic Conductive Film (ACF), which is with good potential in business development. It should be understood that the embodiments disclosed herein shall be considered in a descriptive sense only and not for purposes of limitation. Descriptions of features, advantages, or aspects of each embodiment should be considered as available for other similar features or aspects in other embodiments.

The invention claimed is:

1. A manufacturing method for producing conductive adhesive with spherical graphene, comprising:
    step 1: preparing a monomer, an initiator, a dispersing agent and a solvent to manufacture a monomer mixture, and using the monomer mixture to produce a polymer microsphere;
    step 2: heating pre-treatment or plasma etching pre-treatment to the polymer microsphere;
    step 3: by chemical vapor deposition, the polymer microsphere after pre-treatment from step 2 to grow graphene on the surface of or inside the polymer microsphere, and then obtain the spherical graphene;
    step 4: producing an epoxy gel system made by epoxy, hardener and accelerant with a certain ratio mixing homogeneously;
    step 5: dispersing the spherical graphene from step 3 into the epoxy gel system to produce a pre-material of conductive adhesive with spherical graphene; and
    Step 6: defoaming the pre-material of conductive adhesive of spherical graphene, and then obtain the conductive adhesive with spherical graphene;
    wherein the plasma etching pre-treatment in step 2 is to obtain an active polymer microsphere by etching the polymer microsphere with inductively coupled plasma in sulfur hexafluoride and dioxygen, at 80-150° C. for 2 min~1 h; and
    wherein the chemical vapor deposition in step 3 is dispersing the pretreated polymer microspheres from step 2 into a sealed space of chemical vapor deposition; next, inserting a mixture gas of methane, hydrogen and other auxiliary gas inside the sealed space after vacuuming; and then growing graphene on the surfaces of or inside the polymer microsphere by heating the polymer microsphere pretreated from step 2 with at least one way following:
    infrared ray, thermal radiation, laser, micro-wave, plasma, ultraviolet ray or induction heating.

2. A manufacturing method for producing conductive adhesive with spherical graphene according to claim 1, wherein in step 1, the monomer is acrylic acid, phenylethene, methyl methacrylate or divinylbenzene; the initiator is comprising at least one selected from azobisisobutyronitrile or benzoyl peroxide; the dispersing agent is polyvinylpyrrolidone, polyethylene glycol, polyglycolic acid or polyacrylic acid; the solvent is comprising water and a composition mixed at least one selected from ethanol, methanol or isopropanol.

3. A manufacturing method for producing conductive adhesive with spherical graphene according to claim 1, wherein an amount of the monomer to the monomer mixture is 8 wt %~42 wt %; an amount of the initiator to the monomer mixture is 0.11 wt %~5.2 wt %; an amount of the dispersing agent to the monomer mixture is 4.9 wt %~21 wt %; an amount of the solvent to the monomer mixture is 3 wt %~56 wt %.

4. A manufacturing method for producing conductive adhesive with spherical graphene according to claim 1, wherein the heating pre-treatment in step 2 is to obtain a porous polymer microsphere by dispersing the polymer microsphere into inert atmosphere at 100-500° C. for 0.5-5 h.

5. A manufacturing method for producing conductive adhesive with spherical graphene according to claim 1, wherein a volume ratio for the methane to the mixture gas is 1%~10%; a volume ratio for the hydrogen to the mixture gas is 50%~99%; and the other auxiliary gas is comprising at least one selected from vapor, nitrogen, or argon.

6. A method for producing conductive adhesive with spherical graphene according to claim 1, wherein in step 4, the epoxy is bisphenol A epoxy resins E44, bisphenol A epoxy resins E51, bisphenol A epoxy resins E54, bisphenol A epoxy resins EPON826 or bisphenol A epoxy resins EPON828; the hardener is hexahydrophthalic anhydride, tetrahydrophthalic anhydride, succinic dihydrazide, adipic acid dihydrazide, dicyandiamide or phenylenediamine; the accelerant is 2-ethyl-4-methylimidazole, imidazole, 2-methylimidazole or triethylamine;
    an amount of the epoxy to the epoxy gel system is 80 wt %~95 wt %; an amount of the hardener to the epoxy gel system is 1 wt %~12 wt %; and an amount of the accelerant to the epoxy gel system is 0.3 wt %~5 wt %.

7. A manufacturing method for producing graphene sphere conductive adhesive according to claim 1, wherein in step 5, a mass ratio for the epoxy gel system to the spherical graphene is 100:2~30.

8. A manufacturing method for producing conductive adhesive with spherical graphene, comprising:
    step 1: preparing a monomer, an initiator, a dispersing agent and a solvent to manufacture a monomer mixture, and using the monomer mixture to produce a polymer microsphere;
    step 2: heating pre-treatment or plasma etching pre-treatment to the polymer microsphere;
    step 3: by chemical vapor deposition, the polymer micro ball after pre-treatment from step 2 to grow graphene inside or outside the polymer microsphere, and then obtain the spherical graphene;
    step 4: producing an epoxy gel system made by epoxy, hardener and accelerant with a certain ratio mixing homogeneously;
    step 5: dispersing the spherical graphene from step 3 into the epoxy gel system to produce a pre-material of conductive adhesive with spherical graphene; and
    Step 6: defoaming the pre-material of conductive adhesive with spherical graphene, and then obtain the conductive adhesive with spherical graphene;
    wherein in step 1, the monomer is acrylic acid, phenylethene, methyl methacrylate or divinylbenzene; the initiator is comprising at least one from azobisisobutyronitrile or benzoyl peroxide; the dispersing agent is polyvinylpyrrolidone, polyethylene glycol, polyglycolic acid or polyacrylic acid; the solvent is comprising water and a composition mixed at least one selected from ethanol, methanol or isopropanol; wherein an amount of the monomer to the monomer mixture is 8 wt %~42 wt %; an amount of the initiator to the monomer mixture is 0.11 wt %~5.2 wt %; an amount of the dispersing agent to the monomer mixture is 4.9 wt %~21 wt %; an amount of the solvent to the monomer mixture is 3 wt %~56 wt %;

wherein in step 2, the pre-treatment is to obtain a porous polymer microsphere by dispersing the polymer microsphere into inert atmosphere at 100-500° C. for 0.5-5 h;

wherein in step 2, the plasma etching pre-treatment is to obtain an active polymer microsphere by etching the polymer microsphere with inductively coupled plasma in sulfur hexafluoride and dioxygen, at 80-150° C. for 2 min~1 h;

wherein in step 3, steps of the chemical vapor deposition are dispersing the pretreated polymer microsphere from step 2 into a sealed space of chemical vapor deposition; next, inserting a mixture gas of methane, hydrogen and other auxiliary gas inside the sealed space after vacuuming; and then growing graphene on the surfaces of or inside the polymer microsphere by heating the polymer microsphere pretreated from step 2 with at least one way listed as following: infrared ray, thermal radiation, laser, micro-wave, plasma, ultraviolet ray or induction heating; wherein a volume ratio for the methane to the mixture gas is 1%~10%; a volume ratio for the hydrogen to the mixture gas is 50%~99%; the other auxiliary gas is comprising at least one selected from vapor, nitrogen, or argon;

wherein in step 4, the epoxy is bisphenol A epoxy resins E44, bisphenol A epoxy resins E51, bisphenol A epoxy resins E54, bisphenol A epoxy resins EPON826 or bisphenol A epoxy resins EPON828; the hardener is hexahydrophthalic anhydride, tetrahydrophthalic anhydride, succinic dihydrazide, adipic acid dihydrazide, dicyandiamide or phenylenediamine; the accelerant is 2-ethyl-4-methylimidazole, imidazole, 2-methylimidazole or triethylamine;

an amount of the epoxy to the epoxy gel system is 80 wt %~95 wt %; an amount of ratio for the hardener to the epoxy gel system is 1 wt %~12 wt %; and an amount of the accelerant to the epoxy gel system is 0.3 wt %~5 wt %;

Wherein in step 5, a mass ratio for the epoxy system to the spherical graphene is 100:2~30.

* * * * *